(12) United States Patent
Lee

(10) Patent No.: US 8,351,273 B2
(45) Date of Patent: Jan. 8, 2013

(54) NONVOLATILE MEMORY DEVICE AND METHOD OF OPERATING THE SAME

(75) Inventor: Jung Hwan Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 301 days.

(21) Appl. No.: 12/769,238

(22) Filed: Apr. 28, 2010

(65) Prior Publication Data
US 2010/0315883 A1  Dec. 16, 2010

(30) Foreign Application Priority Data

Jun. 12, 2009 (KR) .................. 10-2009-0052259

(51) Int. Cl.
*G11C 11/34* (2006.01)
(52) U.S. Cl. .............................. 365/185.25; 365/185.24
(58) Field of Classification Search ............. 365/185.24, 365/185.25
See application file for complete search history.

(56) References Cited

U.S. PATENT DOCUMENTS

| 6,643,193 | B2 * | 11/2003 | Yamaki et al. | 365/189.09 |
| 2002/0186593 | A1 * | 12/2002 | Takano et al. | 365/185.21 |
| 2007/0121420 | A1 * | 5/2007 | Lee | 365/233.5 |
| 2008/0019184 | A1 * | 1/2008 | Mitani et al. | 365/185.21 |

FOREIGN PATENT DOCUMENTS

KR    1020090026502    3/2009

OTHER PUBLICATIONS

Notice of Allowance issued from Korean Intellectual Property Office on Mar. 2, 2011.

* cited by examiner

*Primary Examiner* — Michael Tran
(74) *Attorney, Agent, or Firm* — IP & T Group LLP

(57) ABSTRACT

A nonvolatile memory device comprises a memory cell array including a number of bit lines commonly coupled to a source line and each coupled to a number of memory cells, a delay unit configured to delay a sense signal in response to a voltage level of the source line and to output a delayed sense signal, and a page buffer unit configured to sense voltage levels of the bit lines in response to the delayed sense signal.

15 Claims, 4 Drawing Sheets

NONVOLATILE MEMORY DEVICE AND METHOD OF OPERATING THE SAME

CROSS-REFERENCE TO RELATED APPLICATION

Priority to Korean patent application number 10-2009-0052259 filed on Jun. 12, 2009, the entire disclosure of which is incorporated by reference herein, is claimed.

BACKGROUND

Exemplary embodiments relate to a nonvolatile memory device and a method of operating the same and, more particularly, to a nonvolatile memory device and a method of operating the same, which are capable of prohibiting malfunction of an operation for sensing the voltage level of a bit line due to a source bouncing phenomenon.

In recent years, there has been an increasing demand for nonvolatile memory devices which can be electrically programmed and erased and which do not require the refresh function of rewriting data at specific intervals. To develop a high capacity of a memory device capable of storing a large amount of data, technology for the high degree of integration of memory cells is being developed.

To increase the degree of integration of memory cells, a NAND type flash memory device in which a number of the memory cells are coupled in series to form one cell string and two cell strings share one contact has been developed. In such a NAND type flash memory device, program and erase operations are performed by controlling the threshold voltage of a memory cell while injecting or discharging electrons into or from a floating gate according to F-N tunneling.

Accordingly, an erased memory cell has a negative threshold voltage because electrons are discharged from a floating gate. A programmed memory cell has a positive threshold voltage because electrons are injected into a floating gate. However, the NAND type flash memory device has defects resulting from a charge gain or the loss of charges, and so several verification operations are performed on the memory device in relation to such characteristics. Here, a page buffer is used to verify whether the program and erase operations have normally been performed.

The above-described flash memory device performs a program operation by controlling the voltage level of a bit line coupled to a memory cell using the page buffer and performing a read operation or a program verification operation by sensing the voltage level of the bit line.

The known flash memory device includes a number of the memory cells and performs the read or program verification operation on the memory cells coupled to a number of the bit lines. Accordingly, some of the bit lines precharged to a high voltage level have to be discharged to a low voltage level 0 V in response to program states. However, if current flowing through a number of the bit lines is discharged to the source line, a source bouncing phenomenon is generated. Consequently, error can occur during the read or program verification operation because the bit lines, that have to be discharged to a low voltage level, are not fully discharged.

BRIEF SUMMARY

Exemplary embodiments relate to a nonvolatile memory device and a method of operating the same, wherein a control signal to control the connection between the bit line of a memory cell array and the sense node of a page buffer unit is delayed in response to a bouncing potential generated in the source line of the memory cell array. Accordingly, in the case where the voltage level of the bit line is discharged in response to the state of a memory cell, the time for performing a discharge operation can be increased, and so error during a read or program verification operation can be prohibited.

A nonvolatile memory device according to an aspect of the present disclosure includes a plurality of memory cells serially connected between a plurality bit lines and a source line, a delay unit configured to delay a sense signal in response to a voltage level of the source line and to output a delayed sense signal, and a page buffer unit configured to sense voltage levels of the bit lines in response to the delayed sense signal.

The delay unit may delay the sense signal in proportion to the voltage level of the source line and outputs the delayed sense signal.

The page buffer unit may include a latch unit configured to temporarily store program data or to sense and store verification data via a sense node, a bit line sense unit coupled between the sense node and a selected bit line among the number of bit lines and configured to transfer the voltage level of the selected bit line to the sense node in response the delayed sense signal, and a precharge unit coupled to the sense node and configured to precharge the sense node in response to a precharge signal to precharge the selected bit line coupled to the sense node.

The bit line sense unit may precharge the selected bit line for a certain period of time and then senses the voltage level of the selected bit line which varies in response to a program state of a selected memory cell of the memory cells.

The delay unit may include a control signal generator configured to generate a number of control signals in response to the voltage level of the source line, a delay time control unit configured to control a rate of an increase in a pull-up voltage in response to a number of the control signals, and a delayed signal generator configured to delay the sense signal and to generate the delayed sense signal, wherein the delayed signal generator controls a time that the sense signal is delayed in response to the rate of the increase in the pull-up voltage.

The control signal generator may include a number of comparators. The comparators compare the voltage level of the source line and a number of respective reference voltages with different voltage levels and output a number of the respective control signals.

The delay time control unit may include a number of transistors coupled in parallel to a terminal for a power source voltage. The transistors control the rate of the increase in the pull-up voltage in response to a number of the respective control signals.

The delayed signal generator may include a number of inverter units. Each of the inverter units includes pull-up units. Here, the speed of a pull-up operation is controlled in response to the pull-up voltage supplied to the pull-up units, and so the time that each of the inverter units is inverted is controlled by the controlled speed of the pull-up operation.

According to another aspect of the present disclosure, there is provided a method of operating a nonvolatile memory device including a page buffer unit and a plurality of memory cells serially connected between a plurality bit lines and a source line, and the page buffer unit includes a bit line sense unit coupling a selected bit line and a sense node. The method includes coupling the selected bit line to the sense node, precharging the selected bit line by supplying a power source voltage to the sense node, changing a voltage level of the selected bit line in response to a program state of a selected memory cell, when a voltage level of the source line rises, delaying a sense signal in proportion to the voltage level of the source line, and sensing the voltage level of the selected bit line through the sense node in response to a delayed sense signal.

A timing at which the voltage level of the selected bit line is sensed and the time for changing the voltage level of the selected bit line are controlled in response to the delayed sense signal.

If the voltage level of the source line rises and so the time taken to discharge the voltage level of the selected bit line increases, a timing at which the voltage level of the selected bit line is sensed is delayed.

DESCRIPTION OF EMBODIMENTS

Hereinafter, some embodiments of the present disclosure will be described in detail with reference to the accompanying drawings. The figures are provided to allow those having ordinary skill in the art to understand the scope of the embodiments of the disclosure.

Figure 1:
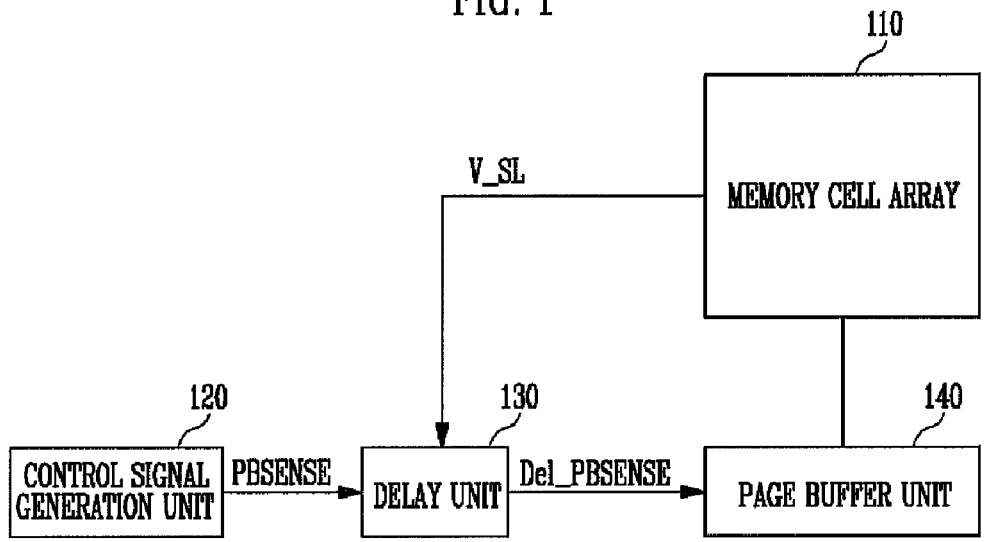
FIG. 1 shows the configuration of a nonvolatile memory device according to an embodiment of this disclosure.

FIG. 1 shows the configuration of a nonvolatile memory device according to an embodiment of this disclosure.

Referring to FIG. 1, the nonvolatile memory device includes a memory cell array 110, a control signal generation unit 120, a delay unit 130, and a page buffer unit 140.

The memory cell array 110 includes a number of bit lines each having a number of memory cells coupled in series thereto. A detailed configuration of the memory cell array 110 is described later.

When the nonvolatile memory device is operated, the control signal generation unit 120 is configured to generate a sense signal PBSENSE.

The delay unit 130 is configured to delay the sense signal PBSENSE for a specific period of time corresponding to the voltage level V_SL of the source line of the memory cell array 110 and to output a delayed sense signal Del_PBSENSE.

The page buffer unit 140 is configured to couple a bit line of the memory cell array 110 with the sense node of the page buffer unit 140 in response to the delayed sense signal Del_PBSENSE and to sense the program state of a memory cell.

Figure 2:
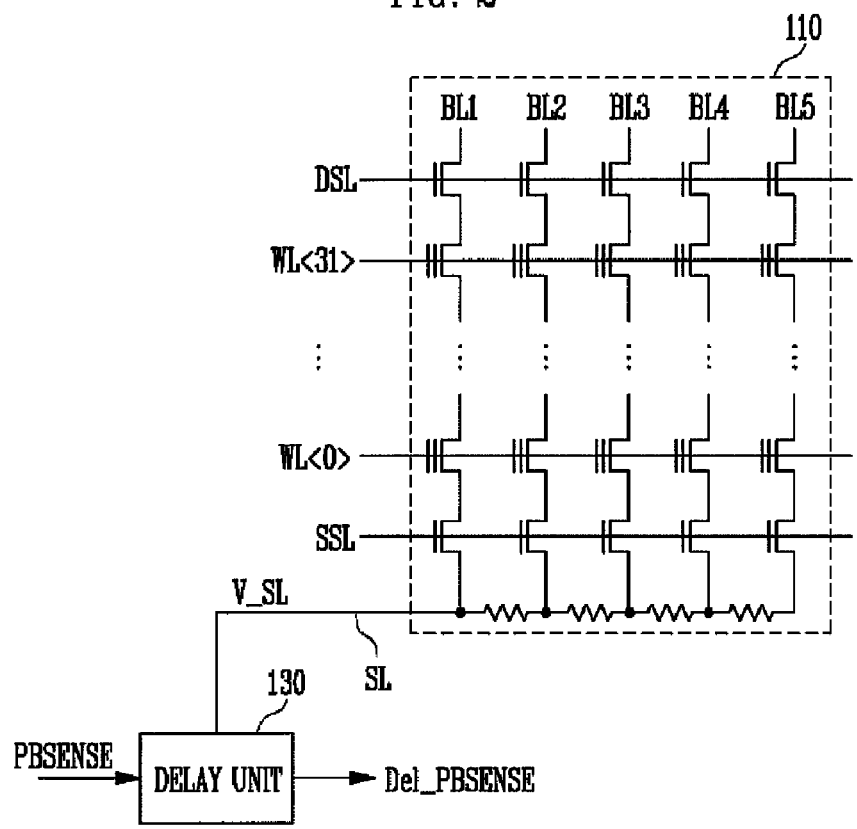
FIG. 2 is a diagram showing the connection relationship between a delay unit and the memory cell array of the nonvolatile memory device according to an embodiment of this disclosure.

FIG. 2 is a diagram showing the connection relationship between the delay unit 130 and the memory cell array 110 of the nonvolatile memory device according to an embodiment of this disclosure.

Referring to FIG. 2, the memory cell array 110 includes a plurality of memory cells serially connected between a plurality bit lines BL1 to BL5 and a source line SL.

The delay unit 130 is configured to delay the sense signal PBSENSE for a specific period of time corresponding to the voltage level V_SL of the source line SL of the memory cell array 110 and to output the delayed sense signal Del_PBSENSE.

Figure 3:
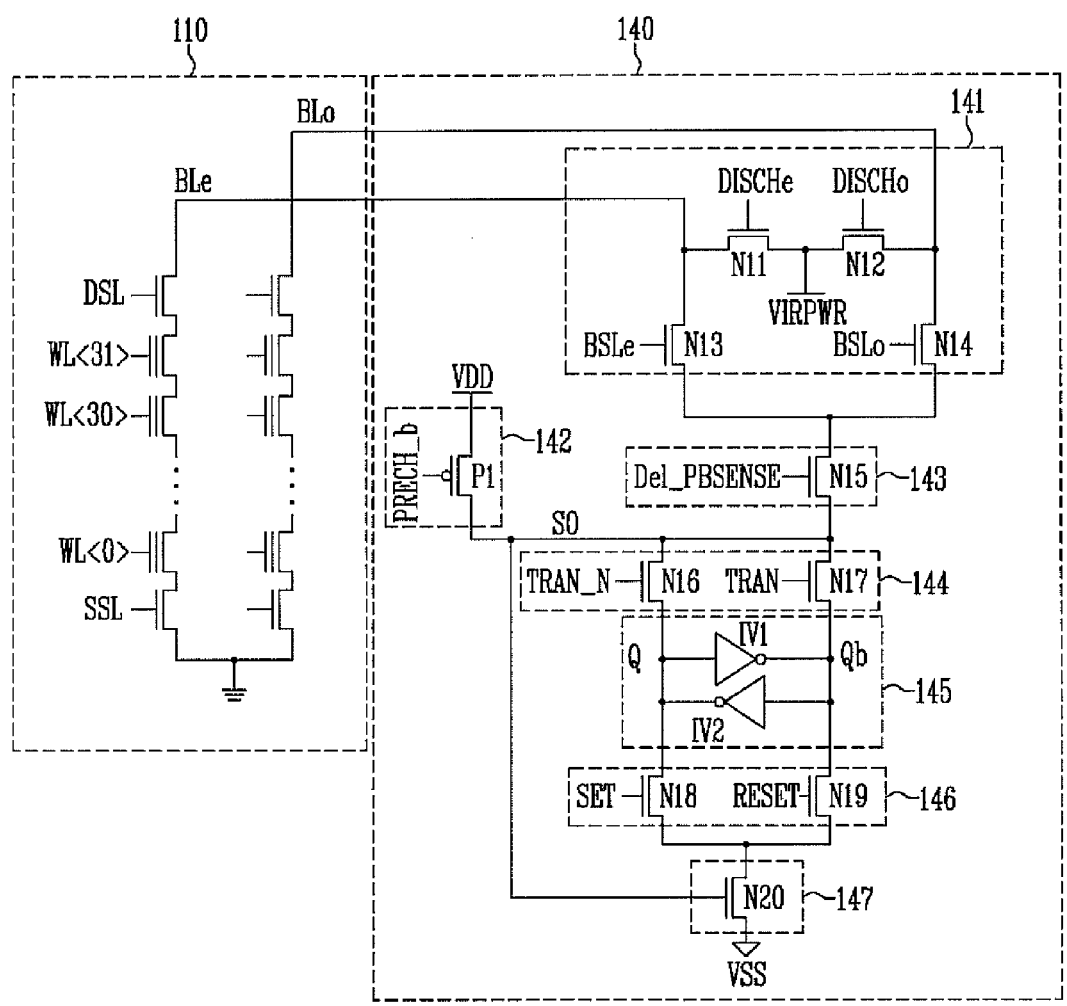
FIG. 3 is a circuit diagram of the page buffer unit of the nonvolatile memory device according to an embodiment of this disclosure.

FIG. 3 is a circuit diagram of the page buffer unit 140 of the nonvolatile memory device according to an embodiment of this disclosure.

The page buffer unit 140 includes a number of page buffers. It is to be noted that in the embodiment of the present disclosure, only one page buffer is illustrated for the sake of convenience.

Referring to FIG. 3, the memory cell array 110 includes the memory cells for storing data, word lines WL<0> to WL<31> for selecting and enabling the memory cells, and bit lines BLe and BLo for inputting and outputting data to and from the memory cells. The memory cell array 110 has a structure in which the plurality of word lines WL<0> to WL<31> and the plurality of bit lines BSLe and BSLo are arranged in a matrix form. The memory cell array 110 has the memory cells coupled in series between a source select transistor SSL and a drain select transistor DSL, which is called a string structure. The gates of the memory cells are coupled to the respective word lines. A set of the memory cells in common coupled to the same word line is called a page. A plurality of the strings coupled to the respective bit lines is coupled in parallel to a common source line, thus constituting a memory block.

The page buffer unit 140 includes a bit line selection unit 141, a bit line sense unit 143, a sense node precharge unit 142, a data latch unit 145, a data transfer unit 144, a data set unit 146, and a sense node sense unit 147. The bit line selection unit 141 is configured to selectively couple a sense node SO via a bit line sense unit 143 with a bit line coupled to a specific cell. The bit line sense unit 143 is configured to selectively couple the sense node SO with a bit line coupled to a specific cell and to sense data stored in the specific cell during read and program verification operations. The sense node precharge unit 142 is configured to supply the sense node SO with a high power source voltage. The data latch unit 145 is configured to temporarily store verification data read from a specific cell. The data transfer unit 144 is configured to supply the sense node SO with data stored in the data latch unit 145 during a program operation. The data set unit 146 is configured to input data to the data latch unit 145. The sense node sense unit 147 is configured to supply a ground voltage to a specific node of the data latch unit 145 in response to a voltage level of the sense node SO.

The bit line selection unit 141 includes an NMOS transistor N13 and an NMOS transistor N14. The NMOS transistor N13 is configured to couple the even bit line BLe with the sense node SO via the bit line sense unit 143 in response to a first bit line selection signal BSLe. The NMOS transistor N14 is configured to couple the odd bit line BLo with the sense node SO via the bit line sense unit 143 in response to a second bit line selection signal BSLo.

The bit line selection unit 141 further includes a control signal input terminal, an NMOS transistor N11, and an NMOS transistor N12. The control signal input terminal is configured to supply a control signal VIRPWR having a specific voltage level. The NMOS transistor N11 is configured to couple the even bit line BLe with the control signal input terminal in response to a first discharge signal DISCHe. The NMOS transistor N12 is configured to couple the odd bit line BLo with the control signal input terminal in response to a second discharge signal DISCHo.

The bit line sense unit 143 is configured to selectively couple the bit line selection unit 141 and the sense node SO in response to a delayed sense signal Del_PBSENSE. To this end, the bit line sense unit 143 includes an NMOS transistor N15 coupled between the bit line selection unit 141 and the sense node SO. A detailed operation of the bit line sense unit 143 will be described hereinafter.

The sense node precharge unit 142 is configured to supply a power source voltage VDD to the sense node SO in response to a precharge signal PRECH_b. To this end, the sense node precharge unit 142 includes a PMOS transistor P1 coupled between the sense node SO and a terminal for the power source voltage VDD. A detailed operation of the sense node precharge unit 142 will be described hereinafter.

The data latch unit 145 is configured to temporarily store data to be programmed into a specific cell or to temporarily store data read from a specific cell. To this end, the data latch unit 145 includes a first inverter IV1 and a second inverter IV2. Here, the output terminal of the first inverter IV1 is coupled to the input terminal of the second inverter IV2, and the output terminal of the second inverter IV2 is coupled to the input terminal of the first inverter IV1.

A node at which the output terminal of the first inverter IV1 is coupled to the input terminal of the second inverter IV2 is called a first node Qb. A node at which the output terminal of the second inverter IV2 is coupled to the input terminal of the first inverter IV1 is called a second node Q.

For example, in the case where data of a high voltage level are supplied to the first node Qb, the corresponding data are inverted by the second inverter IV2, and so data of a low voltage level are supplied to the second node Q, and the data of a low voltage level are again inverted by the first inverter IV1. Consequently, a data storage phenomenon occurs in a manner that the data of a high voltage level supplied to the first node Qb remains intact. To the contrary, in the case in which data of a low voltage level are supplied to the first node Qb, the corresponding data are inverted by the second inverter IV2, data of a high voltage level are supplied to the second node Q, the data of a high voltage level are again inverted by the first inverter IV1. Consequently, a data storage phenomenon occurs in a manner that the data of a low voltage level supplied to the first node Qb remains intact.

The data transfer unit 144 is configured to selectively supply the sense node SO with data stored in the first node Qb or the second node Q of the data latch unit 145. To this end, the data transfer unit 144 includes a first transfer transistor N17 configured to selectively couple the first node Qb with the sense node SO and a second transfer transistor N16 configured to selectively couple the second node Q with the sense node SO.

The first transfer transistor N17 transfers data, stored in the first node Qb, to the sense node SO in response to a first data transfer signal TRAN. Furthermore, the second transfer transistor N16 transfers data, stored in the second node Q, to the sense node SO in response to a second data transfer signal TRAN_N.

Accordingly, in the case where data stored in the first node Qb is sought to be transferred to the sense node SO, the first data transfer signal TRAN of a high voltage level is supplied to the first transfer transistor N17. In the case where data stored in the second node Q is sought to be transferred to the sense node SO, the second data transfer signal TRAN_N of a high voltage level is supplied to the second transfer transistor N16.

The data set unit 146 includes a first data set transistor N19 and a second data set transistor N18. The first data set transistor N19 is configured to supply the ground voltage to the first node Qb of the data latch unit 145. The second data set transistor N18 is configured to supply the ground voltage to the second node Q of the data latch unit 145.

The first data set transistor N19 is coupled between the sense node sense unit 147 and the first node Qb and configured to supply the ground voltage, received from the sense node sense unit 147, to the first node Qb in response to a first data set signal RESET.

Furthermore, the second data set transistor N18 is coupled between the sense node sense unit 147 and the second node Q and configured to supply the ground voltage, received from the sense node sense unit 147, to the second node Q in response to a second data set signal SET.

The sense node sense unit 147 is configured to supply the ground voltage to the data set unit 146 in response to a voltage level of the sense node SO. To this end, the sense node sense unit 147 includes an NMOS transistor N20 coupled between the data set unit 146 and the ground terminal.

Accordingly, the ground voltage is supplied to the data set unit 146 in response to a voltage level of the sense node SO. Only when the voltage level of the sense node SO is in a high voltage level, the ground voltage is supplied to the data set unit 146. Here, when the first data set signal RESET of a high voltage level is supplied to the first data set transistor N19, the ground voltage is supplied to the first node Qb. It is considered that data of a low voltage level have been supplied to the first node Qb. However, when the second data set signal SET of a high voltage level is supplied to the second data set transistor N18, the ground voltage is supplied to the second node Q. It is considered that data of a high voltage level have been supplied to the first node Qb.

Figure 4:
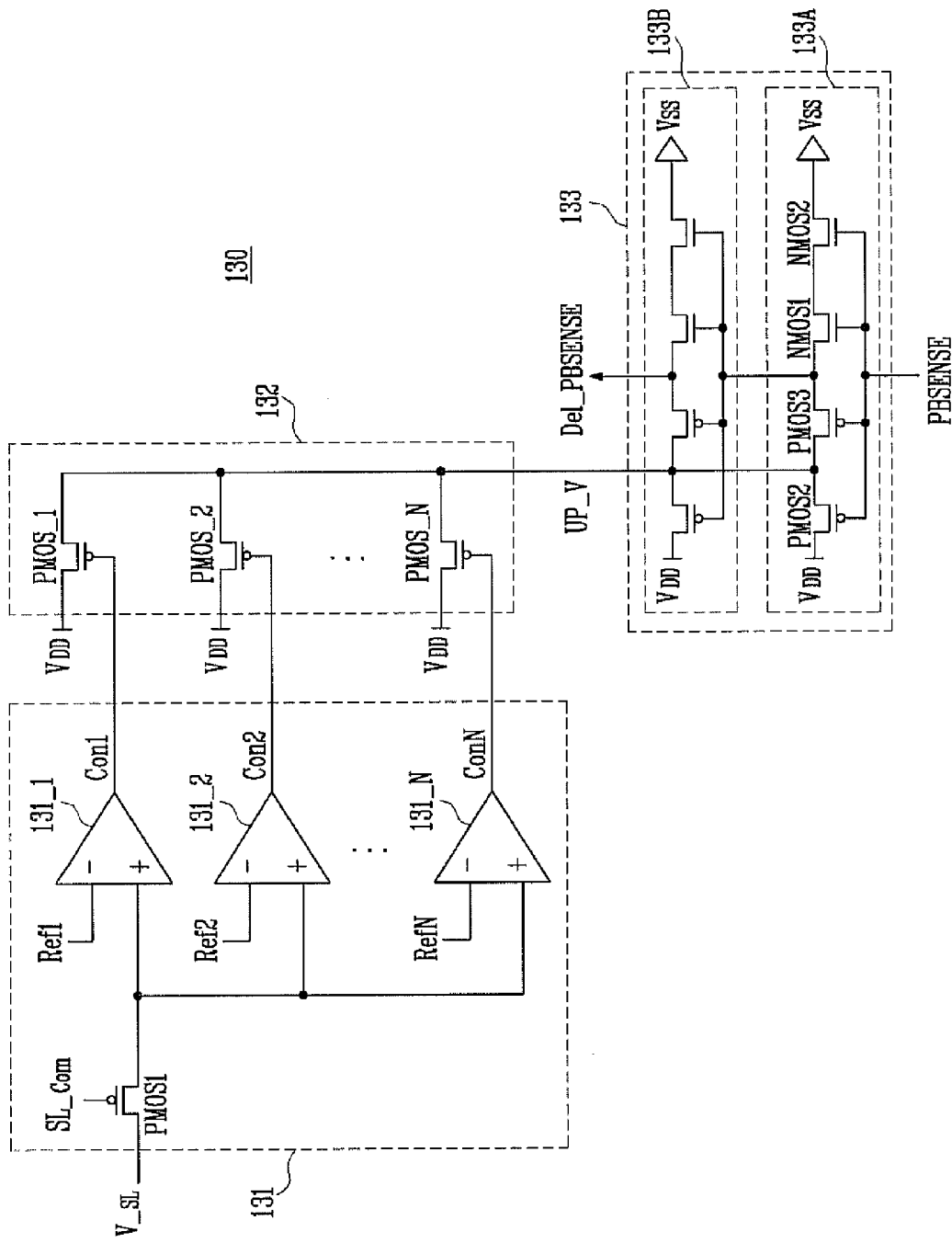
FIG. 4 is a detailed circuit diagram of the delay unit shown in FIG. 2.

FIG. 4 is a detailed circuit diagram of the delay unit 130 shown in FIG. 2.

Referring to FIG. 4, the delay unit 130 includes a control signal generator 131, a delay time controller 132, and a delayed signal generator 133.

The control signal generator 131 includes a PMOS transistor PMOS1 and a number of comparators 131_1 to 131_N. The PMOS transistor PMOS1 is configured to receive the voltage level V_SL of the source line SL in response to a compensation enable signal SL_Com which is enabled at a low voltage level when an evaluation operation for the bit lines coupled to the page buffer unit is started and to output the voltage level V_SL to the comparators 131_1 to 131_N. The comparators 131_1 to 131_N are configured to compare the voltage level V_SL of the source line SL and a number of respective reference voltages Ref1 to RefN and to output a number of respective control signals Con_1 to Con_N as results of the comparison. For example, in the case where the voltage level V_SL of the source line SL is less than each of the reference voltages Ref1 to RefN because a bouncing phenomenon has not occurred, the control signals Con_1 to Con_N, each having a low voltage level, are outputted. With a gradual increase in the voltage level V_SL of the source line SL, the number of control signals Con_1 to Con_N outputted at a high voltage level is increased.

The delay time controller 132 includes a number of PMOS transistors PMOS_1 to PMOS_N. The PMOS transistors PMOS_1 to PMOS_N are coupled in parallel to the terminal for the power source voltage VDD and are turned on in response to the respective control signals Con_1 to Con_N and to output a pull-up voltage UP_V. For example, with an increase in the number of control signals Con_1 to Con_N outputted at a high voltage level, the pull-up voltage UP_V rapidly rises.

The delayed signal generator 133 includes a first inverter unit 133A and a second inverter unit 133B. The first inverter unit 133A and the second inverter unit 133B are coupled in series to each other, and an additional inverter unit can be further included according to the design. The first inverter unit 133A and the second inverter unit 133B have a similar structure, and so only the first inverter unit 133A is described as an example. The first inverter unit 133A includes a number of PMOS transistors PMOS2 and PMOS3 and a number of NMOS transistors NMOS1 and NMOS2. The PMOS transistors PMOS2 and PMOS3 are pull-up units to which the power source voltage VDD is supplied, and the NMOS transistors NMOS1 and NMOS2 are pull-down units whose output nodes are discharged by the ground voltage VSS. The PMOS transistors PMOS2 and PMOS3 and the NMOS transistors NMOS1 and NMOS2 are turned on or off in response to the sense signal PBSENSE and are configured to output an output signal having an inverted logic level of a logic level of the sense signal PBSENSE through their output terminal. Here, the delay time during the inversion operation of the first inverter unit 133A is changed in response to the rate of an increase of the pull-up voltage UP_V which is inputted to a node between the PMOS transistors PMOS2 and PMOS3. In other words, when the pull-up voltage UP_V is high, the inversion operation of the first inverter unit 133A is rapidly performed, and so the delay time is small. However, when the pull-up voltage UP_V is low, the inversion operation of the first inverter unit 133A is slowly performed, and so the delay time is increased. Consequently, a delay in the inversion operation of the first inverter unit 133A is determined in response to the pull-up operation of the first inverter unit 133A.

In the same manner that the delay time is changed during the inversion operation of the first inverter unit 133A, the delay time is also changed during the inversion operation of the second inverter unit 133B.

As described above, the delay unit 130 is configured to increases the delay time of the sense signal PBSENSE with a gradual increase in the voltage level V_SL of the source line SL and to output the delayed sense signal Del_PBSENSE.

Figure 5:
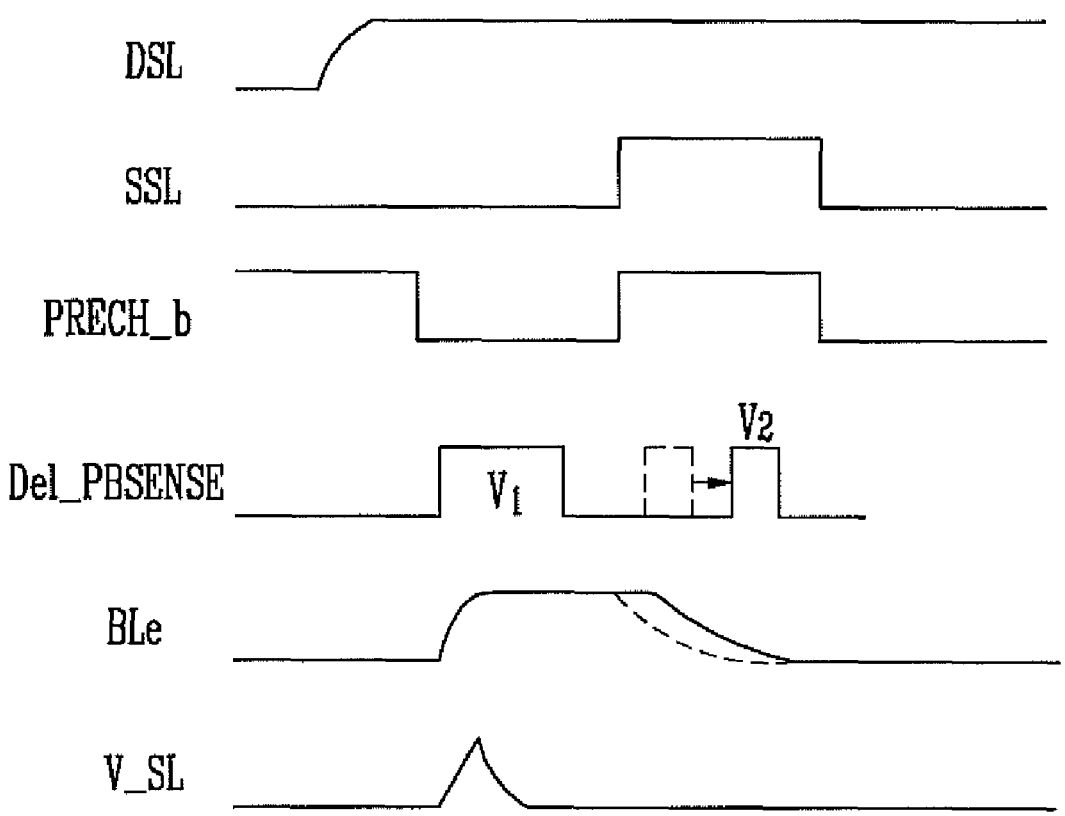
FIG. 5 is a waveform showing signals of the nonvolatile memory device and the voltage levels of a word line according to an embodiment of this disclosure.

FIG. 5 is a waveform showing signals of the nonvolatile memory device and the voltage levels of a word line according to an embodiment of this disclosure.

The operation of the nonvolatile memory device is described hereinafter with reference to FIGS. 1 to 5.

First, the precharge signal PRECH_b that has been supplied at a high voltage level is shifted to a low voltage level and then supplied to the PMOS transistor P1. Thus, the power source voltage VDD is supplied to the sense node SO of the page buffer 140. At this time, the first bit line selection signal BSLe is supplied to the bit line selection unit 141, and so the NMOS transistor N13 is turned on. Next, the delayed sense signal Del_PBSENSE of a high voltage level is supplied as a voltage level V1, thereby coupling the sense node SO with a selected bit line (e.g., the even bit line BLe). Accordingly, the even bit line BLe is precharged to a high voltage level (V1-Vth), wherein Vth is the threshold voltage of the NMOS transistor N15.

After a lapse of a certain time, the delayed sense signal Del_PBSENSE of a low voltage level is supplied, and so the connection between the even bit line BLe and the sense node SO is broken. Consequently, a voltage level of the precharge signal PRECH_b shifts to a high voltage level, and then the power source voltage VDD is not supplied to the sense node SO.

The even bit line BLe is maintained at the high voltage level (V1-Vth) or discharged to have a low voltage level in response to the program state of a memory cell selected from among a number of the memory cells. That is, the voltage level of the even bit line BLe is maintained or discharged because the selected memory cell is turned on or off in response to a read or program verification voltage supplied to a word line coupled to the selected memory cell. In other words, in the case where the selected memory cell has been programmed with a threshold voltage higher than a target threshold voltage, the even bit line BLe is maintained at the high voltage level. Meanwhile, in the case where the selected memory cell has been programmed with a threshold voltage less than the target threshold voltage, the even bit line BLe is discharged to have a low voltage level.

Here, if the voltage level of the even bit line BLe of a number of the bit lines is discharged, the amount of current flowing through the source line SL sharply increases, resulting in a bouncing phenomenon in which the voltage level V_SL of the source line SL rises. Although the voltage level of the even bit line BLe must be discharged as indicated by a dotted line in FIG. 4, the amount of current discharged in the even bit line BLe is decreased and the voltage level of the even bit line BLe is slowly discharged because a difference in the voltage level between the even bit line BLe and the source line SL is decreased.

The delay unit 130 receives the sense signal PBSENSE from the control signal generator 120, delays the received sense signal PBSENSE for a specific period of time corresponding to the voltage level V_SL of the source line SL, and outputs the delayed sense signal Del_PBSENSE.

Table 1 shows the delay times of the delay unit 130 in response to the voltage level V_SL of the source line SL.

TABLE 1

| VOLTAGE LEVEL V_SL OF SOURCE LINE | DELAY TIME OF DELAY UNIT |
|---|---|
| 0 mV | 0 nS |
| 50 mV | 5 nS |
| 100 mV | 10 nS |
| 150 mV | 15 nS |
| 200 mV | 20 nS |

As shown in Table 1, the delay unit 130 delays the sense signal PBSENSE in proportion to the voltage level V_SL of the source line SL and outputs the delayed sense signal Del_PBSENSE having a voltage level V2.

The delayed sense signal Del_PBSENSE is supplied to the bit line sense unit 143 of the page buffer unit 140, thereby coupling the sense node SO with the even bit line BLe. Here, the time, that the even bit line BLe and the sense node SO are coupled together, is delayed by the delayed sense signal Del_PBSENSE. Even though the voltage level of the even bit line BLe is slowly discharged because of a source bouncing phenomenon, the discharge time is increased. Consequently, the even bit line BLe coupled to the sense node SO is sufficiently discharged to have a low voltage level, and a sense margin is increased when a sense operation is performed using the page buffer unit 140. Accordingly, error during read and program verification operations can be prohibited.

According to the present disclosure, a control signal to control the connection between a bit line of the memory cell array and the sense node of the page buffer unit is delayed in response to a bouncing potential generated in the source line of the memory cell array. Accordingly, in the case where the voltage level of the bit line is discharged in response to the state of a memory cell, the time that it takes to perform the discharge can be increased, and so error during a read or program verification operation can be prohibited.

What is claimed is:
1. A nonvolatile memory device, comprising:
a plurality of memory cells coupled between a plurality bit lines and a source line;

a delay unit configured to delay a sense signal in response to a voltage level of the source line and to output a delayed sense signal; and a page buffer unit configured to sense voltage levels of the bit lines in response to the delayed sense signal.

2. The nonvolatile memory device of claim 1, wherein the delay unit delays the sense signal in proportion to the voltage level of the source line and outputs the delayed sense signal.

3. The nonvolatile memory device of claim 1, wherein the page buffer unit comprises:

a latch unit configured to temporarily store program data or to sense and store verification data via a sense node;

a bit line sense unit coupled between the sense node and a selected bit line among the plurality bit lines and configured to transfer the voltage level of the selected bit line to the sense node in response the delayed sense signal; and a precharge unit coupled to the sense node and configured to precharge the sense node in response to a precharge signal to precharge the selected bit line coupled to the sense node.

4. The nonvolatile memory device of claim 3, wherein the bit line sense unit precharges the selected bit line for a certain period of time and then senses the voltage level of the selected bit line which varies in response to a program state of a selected memory cell of the memory cells.

5. A nonvolatile memory device of claim 1, wherein if the voltage level of the source line rises and a rate of discharge of the bit lines decreases, a timing at which the voltage levels of the bit lines are sensed is delayed in response to the delayed sense signal so that a time for discharging the voltage levels of the bit lines is increased.

6. The nonvolatile memory device of claim 5, wherein the delay unit delays the sense signal in proportion to the voltage level of the source line and outputs the delayed sense signal.

7. The nonvolatile memory device of claim 5, wherein the page buffer unit comprises:

a latch unit configured to temporarily store program data or to sense and store verification data via a sense node;

a bit line sense unit coupled between the sense node and a selected bit line among the bit lines and configured to transfer the voltage level of the selected bit line to the sense node in response the delayed sense signal; and a precharge unit coupled to the sense node and configured to precharge the sense node in response to a precharge signal to precharge the selected bit line coupled to the sense node.

8. The nonvolatile memory device of claim 7, wherein the bit line sense unit precharges the selected bit line for a certain period of time and then senses the voltage level of the selected bit line which varies in response to a program state of a selected memory cell of the memory cells.

9. The nonvolatile memory device of claim 5, wherein the delay unit comprises:

a control signal generator configured to generate a number of control signals in response to the voltage level of the source line;

a delay time control unit configured to control a rate of an increase in a pull-up voltage in response to a number of the control signals; and a delayed signal generator configured to delay the sense signal and to generate the delayed sense signal, wherein the delayed signal generator controls a time that the sense signal is delayed in response to the rate of the increase in the pull-up voltage.

10. The nonvolatile memory device of claim 9, wherein:

the control signal generator comprises a number of comparators, and the comparators compare the voltage level of the source line and a number of respective reference voltages with different voltage levels and output a number of the respective control signals.

11. The nonvolatile memory device of claim 9, wherein:

the delay time control unit comprises a number of transistors coupled in parallel to a terminal for a power source voltage, and a number of the transistors control the rate of the increase in the pull-up voltage in response to a number of the respective control signals.

12. The nonvolatile memory device of claim 9, wherein:

the delayed signal generator comprises a number of inverter units, and each of the inverter units comprises pull-up units, wherein a speed of a pull-up operation is controlled in response to the pull-up voltage supplied to the pull-up units, and a time that each of the inverter units is inverted is controlled by the controlled speed of the pull-up operation.

13. A method of operating a nonvolatile memory device comprising a page buffer unit and a plurality of memory cells coupled between a plurality bit lines and to a source line, and the page buffer unit comprises a bit line sense unit coupling a selected bit line and a sense node, the method comprising:

coupling the selected bit line to the sense node;

precharging the selected bit line by supplying a power source voltage to the sense node;

changing a voltage level of the selected bit line in response to a program state of a selected memory cell;

when a voltage level of the source line rises, delaying a sense signal in proportion to the voltage level of the source line; and sensing the voltage level of the selected bit line through the sense node in response to a delayed sense signal.

14. The method of claim 13, wherein a timing at which the voltage level of the selected bit line is sensed and a time for changing the voltage level of the selected bit line are controlled in response to the delayed sense signal.

15. The method of claim 13, wherein if the voltage level of the source line rises and a time for discharging the voltage level of the selected bit line increases, a timing at which the voltage level of the selected bit line is sensed is delayed.

* * * * *